(12) United States Patent
Ternullo, Jr. et al.

(10) Patent No.: US 6,327,215 B1
(45) Date of Patent: Dec. 4, 2001

(54) LOCAL BIT SWITCH DECODE CIRCUIT AND METHOD

(75) Inventors: Luigi Ternullo, Jr., Allentown, PA (US); Howard C. Kirsch, Austin, TX (US)

(73) Assignee: Vanguard International Semiconductor Corporation, Hsin-Chu (TW)

( * ) Notice: Subject to any disclaimer, the term of this patent is extended or adjusted under 35 U.S.C. 154(b) by 0 days.

(21) Appl. No.: 09/670,405

(22) Filed: Sep. 28, 2000

(51) Int. Cl.[7] ....................................................... G11C 8/00
(52) U.S. Cl. ......................... 365/230.06; 365/63; 365/207
(58) Field of Search ................................. 365/230.06, 63, 365/207, 208

(56) References Cited

U.S. PATENT DOCUMENTS

| | | | |
|---|---|---|---|
| 5,812,473 | 9/1998 | Tsai | 365/205 |
| 5,822,268 * | 10/1998 | Kirihata | 365/230.03 |
| 5,923,605 | 7/1999 | Mueller et al. | 365/230.03 |
| 5,940,329 * | 8/1999 | Seitsinger et al. | 365/189.05 |
| 5,949,732 | 9/1999 | Kirihata | 365/230.03 |
| 5,968,913 * | 11/1999 | Childers et al. | 365/51 |

* cited by examiner

*Primary Examiner*—Son T. Dinh
(74) *Attorney, Agent, or Firm*—George O. Saile; Stephen B. Ackerman; Larry J. Prescott

(57) ABSTRACT

A local bit switch selecting circuit and method for systems having a first number of banks of sense amplifiers with a second number of sense amplifiers in each sense amplifier bank. The bit switch selecting circuit and method use a single N channel field effect transistor in each sense amplifier bank. This provides bit switch selecting capability while significantly reducing the number of devices and chip area required.

28 Claims, 4 Drawing Sheets

LOCAL BIT SWITCH DECODE CIRCUIT AND METHOD

BACKGROUND OF THE INVENTION (1) Field of the Invention

This invention relates to a global bit switch circuit and method for activating a bit switch across a number of sense amplifier sections in more than one bank of sense amplifiers which avoids disruption of non selected sense amplifiers.

(2) Description of the Related Art

U.S Pat. No. 5,923,605 to Mueller et al. describes a multi-bank DRAM capable of overlapped reading and writing to different banks of the DRAM.

U.S. Pat. No. 5,812,473 to Tsai describes a DRAM having a sense amplifier connected to a bit line pair of a memory cell array through a column select switch. The data line pairs are provided with pass gates. A first pair of gates connects a sense amplifier output of a bit line pair to a first data line pair and a second pair of gates connects the sense amplifier output of the bit line pair to a second data line pair. Each bit line pair can be connected through a sense amplifier to either first or second data line pairs.

U.S. Pat. No. 5,949,732 to Kirihata describes a method for structuring a multi-bank DRAM into a hierarchical column select line architecture. The DRAM has multiple banks with a switch for selecting one of the banks and a switch for selecting one of the columns within the bank. This allows switches to couple one of the bit lines to one of the data lines, enabling data to be written into or read out of memory cells common to the selected bank and to the selected column.

SUMMARY OF THE INVENTION

Many SDRAM, static dynamic random access memory, designs use a number of banks of sense amplifiers having an equal number of sense amplifiers in each bank. These designs usually have two or four banks of sense amplifiers. Pass gates in each of the sense amplifiers provide means to connect data lines to or isolate data lines from the sense amplifiers. Many of these designs use a global bit switch scheme wherein the bit switch will be activated across a number of sense amplifiers within a single bank simultaneously. Multi bank architecture designs allow for more than one bank to be open at a time. In multi bank designs the global bit switch can potentially cause disruption in non selected sense amplifiers and a local bit switch must be used. Chip area is a critical aspect that must be considered in the local bit switch design.

FIG. 1 shows a diagram of a local bit switch selecting circuit using NOR, Not OR, gates as local bit switches. The circuit of FIG. 1 has a first number, L, of sense amplifier banks 11(i) each having a second number, M, of sense amplifiers 10(ij). Each of the sense amplifiers 10(ij) has a first input connected to a first pass gate 12(ij) and a second input connected to a second pass gate 13(ij). Each of the first pass gates 12(ij) are connected in series between the first input 18(ij) of one of the sense amplifiers and a first data line 14(ij). Each of the second pass gates 13(ij) are connected in series between the second input 19(ij) of one of the sense amplifiers and a second data line 15(ij). In the reference numbers 12(ij), 13(ij), 14(ij), 15(ij), 18(ij), and 19(ij), i takes on all integer values from 1 to L and j takes on all integer values from 1 to M. The first pass gates 12(ij) each consist of a first N channel field effect transistor having a source, drain and gate and the second pass gates 13(ij) each consist of a second N channel field effect transistor having a source, drain, and gate. The first input 18(ij) of each of the sense amplifiers is connected to the drain of one of the first N channel field effect transistors 12(ij) and the source of that first N channel field effect transistor 12(ij) is connected to the corresponding first data line 14(ij). The second input 19(ij) of each of the sense amplifiers is connected to the drain of one of the second N channel field effect transistors 13(ij) and the source of that second N channel field effect transistor 13(ij) is connected to the corresponding second data line 15(ij).

In the above description, and in the descriptions to follow the first number, L, is a positive integer greater than one, typically but not necessarily four, and the second number, M, is a positive integer greater than one. In the reference numbers 10(ij), 11(i), 12(ij), 13(ij), 14(ij), 15(ij), 18(ij), and 19(ij), i takes on all integral values from 1 to L and j takes on all integral values from 1 to M.

The circuit shown in FIG. 1 uses L NOR gates 20(i) as local bit select switches, one in each of the L sense amplifier banks. Each of the NOR gates has two inputs. A first input of each of the NOR gates is connected to a local bit select line 30(i). The second inputs of the all of the NOR gates are connected together and to a global bit select line 400. In the reference numbers 20(i) and 30(i), i takes on all integer values from 1 to L.

As can be seen from FIG. 1 when the global bit line 400 is high none of the pass gates, 12(ij) and 13(ij), will be activated. When the global bit line 400 is low the pass gates, 12(ij) and 13(ij), in a sense amplifier bank 11(i) having a low local bit line 30(i) will be activated; and the pass gates, 12(ij) and 13(ij), in a sense amplifier bank 11(i) having a high local bit line 30(i) will not be activated.

Another possible local bit switch design is shown in FIG. 2. In the circuit in FIG. 2 each of the local bit lines 30(i) are connected to a circuit comprising an inverter 22(i) and a pass gate 24(i). For each of the local bit lines 30(i), an NMOS transistor 25(i) is connected between the $V_{ss}$ supply and the output node 27(i) of the pass gate 24(i). In this NMOS transistor 25(i) the drain is connected to the pass gate 24(i) output node 27(i), the source connected to the $V_{ss}$ supply, and the gate connected to the inverter 22(i) output. The purpose of these NMOS transistors 25(i) is to keep the output node 27(i) of the pass gate 24(i) from floating when the voltage at node 400 is low. In the reference numbers 22(i), 24(i), 25(i), 27(i), and 30(i), i takes on all integer values from 1 to L. As can be seen from FIG. 2 when the global bit line 400 is low the local bit lines 30(i) are isolated from the pass gates, 12(ij) and 13(ij). When the global bit line 400 is high the local bit lines 30(i) are connected to the pass gates, 12(ij) and 13(ij); so that the pass gates, 12(ij) and 13(ij), in a sense amplifier 11(i) having a high local bit line 30(i) will be activated and the pass gates, 12(ij) and 13(ij), in a sense amplifier bank 11(i) having a low local bit line 30(i) will not be activated.

A problem with the circuit shown in FIG. 1 is that each of the NOR gates 20(i) requires four transistors. The problem with the circuit shown in FIG. 2 is that each of the inverters 22(i) requires two transistors, each of the pass gates 24(i) requires two transistors, and an extra transistor 25(i) results in a total of five transistors in each of the sense amplifier banks. With a premium on chip area it is desirable to have local bit switches which uses fewer transistors and less chip area.

It is a principle objective of this invention to provide 1 local bit switch design for global bit switch decoding schemes in multi bank sense amplifier arrays which minimizes the number of devices required and the amount of chip area used.

This objective is accomplished by using a local bit switch design which requires only a single N channel field effect transistor in each sense amplifier bank.

DESCRIPTION OF THE PREFERRED EMBODIMENTS

A preferred embodiment of the local bit switch selecting circuit of this invention will now be described with reference to FIGS. 3–5. The circuit shown in FIG. 3 has a first number, L, of sense amplifier banks 11(i) each having a second number, M, of sense amplifiers 10(ij). Each of the sense amplifiers 10(ij) has a first input connected to a first pass gate 12(ij) and a second input connected to a second pass gate 13(ij). Each of the first pass gates 12(ij) are connected in series between the first input 18(ij) of one of the sense amplifiers and a first data line 14(ij). Each of the second pass gates 13(ij) are connected in series between the second input 19(ij) of one of the sense amplifiers and a second data line 15(ij). In the reference numbers 12(ij), 13(ij), 14(ij), 15(ij), 18(ij), and 19(ij), i takes on all integer values from 1 to L and j takes on all integer values from 1 to M.

The first pass gates 12(ij) each consist of a first N channel field effect transistor having a source, drain, gate, and a first threshold voltage. The second pass gates 13(ij) each consist of a second N channel field effect transistor having a source, drain, gate, and the first threshold voltage. It is important to this invention that both the first N channel field effect transistor and the second N channel field effect transistor have the same threshold voltage. The first input 18(ij) of each of the sense amplifiers is connected to the drain of one of the first N channel field effect transistors 12(ij) and the source of that first N channel field effect transistor 12(ij) is connected to the corresponding first data line 14(ij). The second input 19(ij) of each of the sense amplifiers is connected to the drain of one of the second N channel field effect transistors 13(ij) and the source of that second N channel field effect transistor 13(ij) is connected to the corresponding second data line 15(ij).

In the above description, and in the descriptions to follow, the first number, L, is a positive integer greater than one, typically but not necessarily four. The second number, M, is also a positive integer greater than one. In the reference numbers 10(ij), 11(i), 12(ij), 13(ij), 14(ij), and 15(ij), i takes on all integral values from 1 to L and j takes on all integral values from 1 to M.

Figure 1:
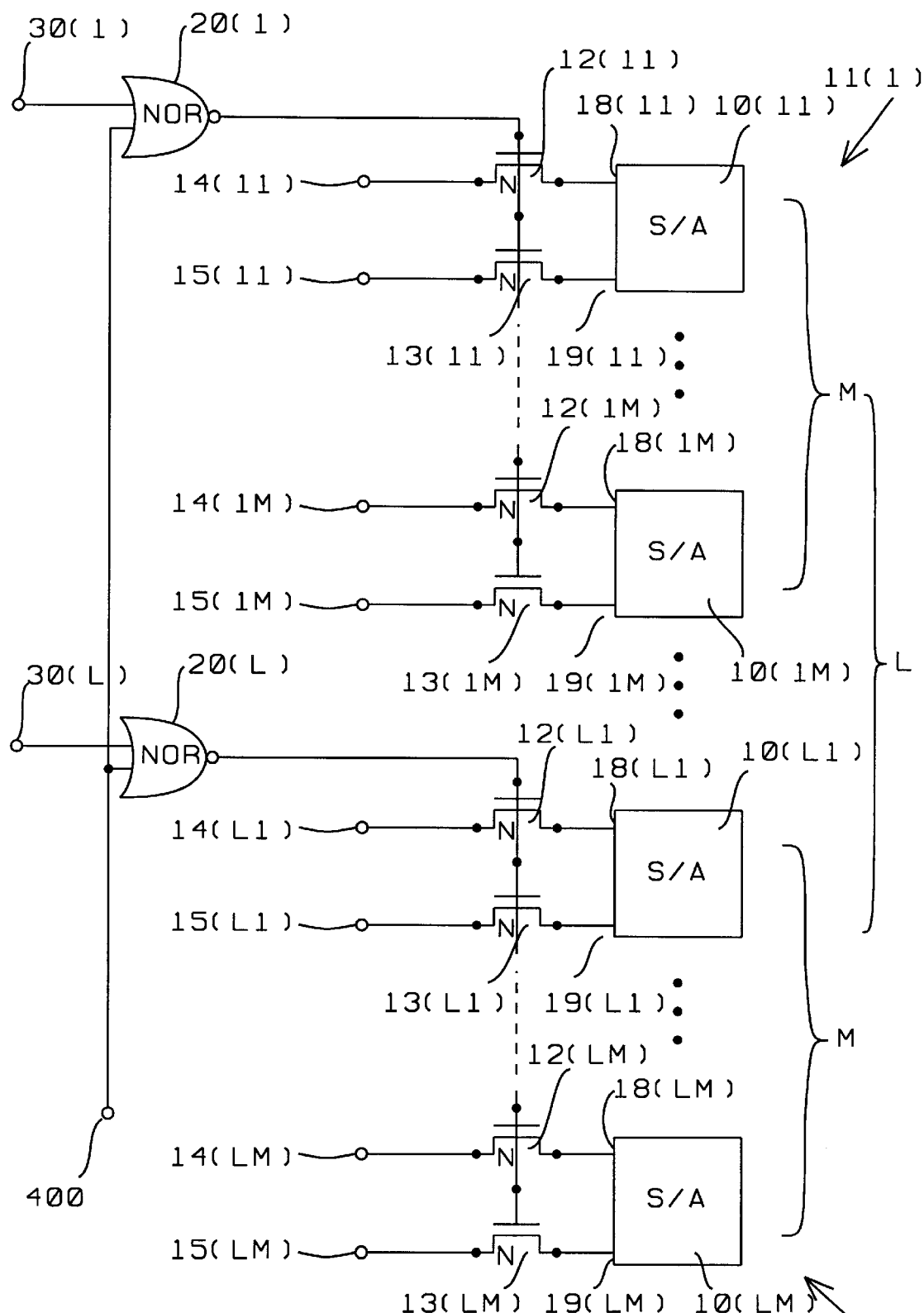
FIG. 1 shows a diagram of a local bit switch circuit using a NOR gate in each of the banks of sense amplifiers.
Figure 2:
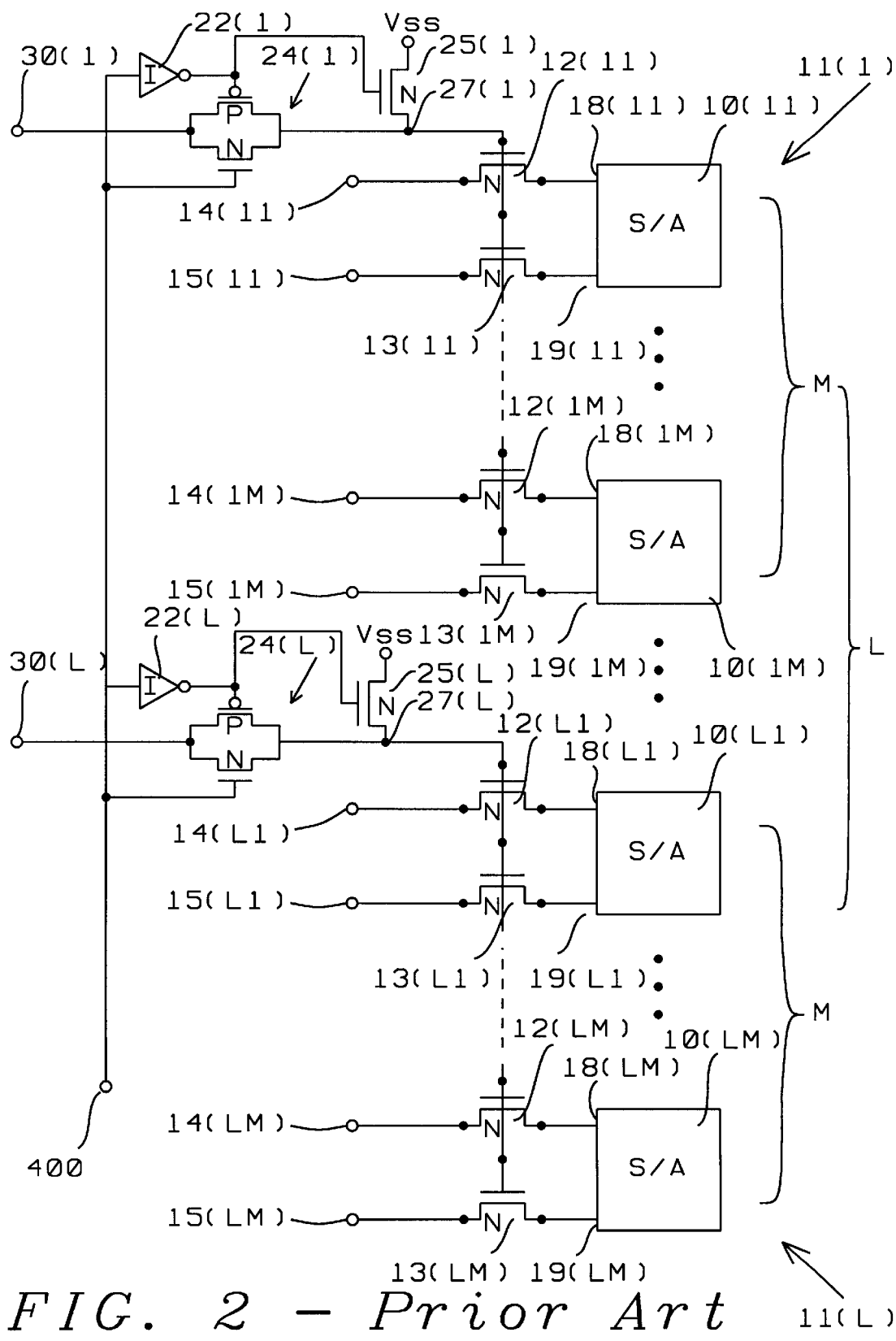
FIG. 2 shows a diagram of a local bit switch circuit using a CMOS inverter, a CMOS pass gate, and an NMOS transistor in each of the banks of sense amplifiers.
Figure 3:
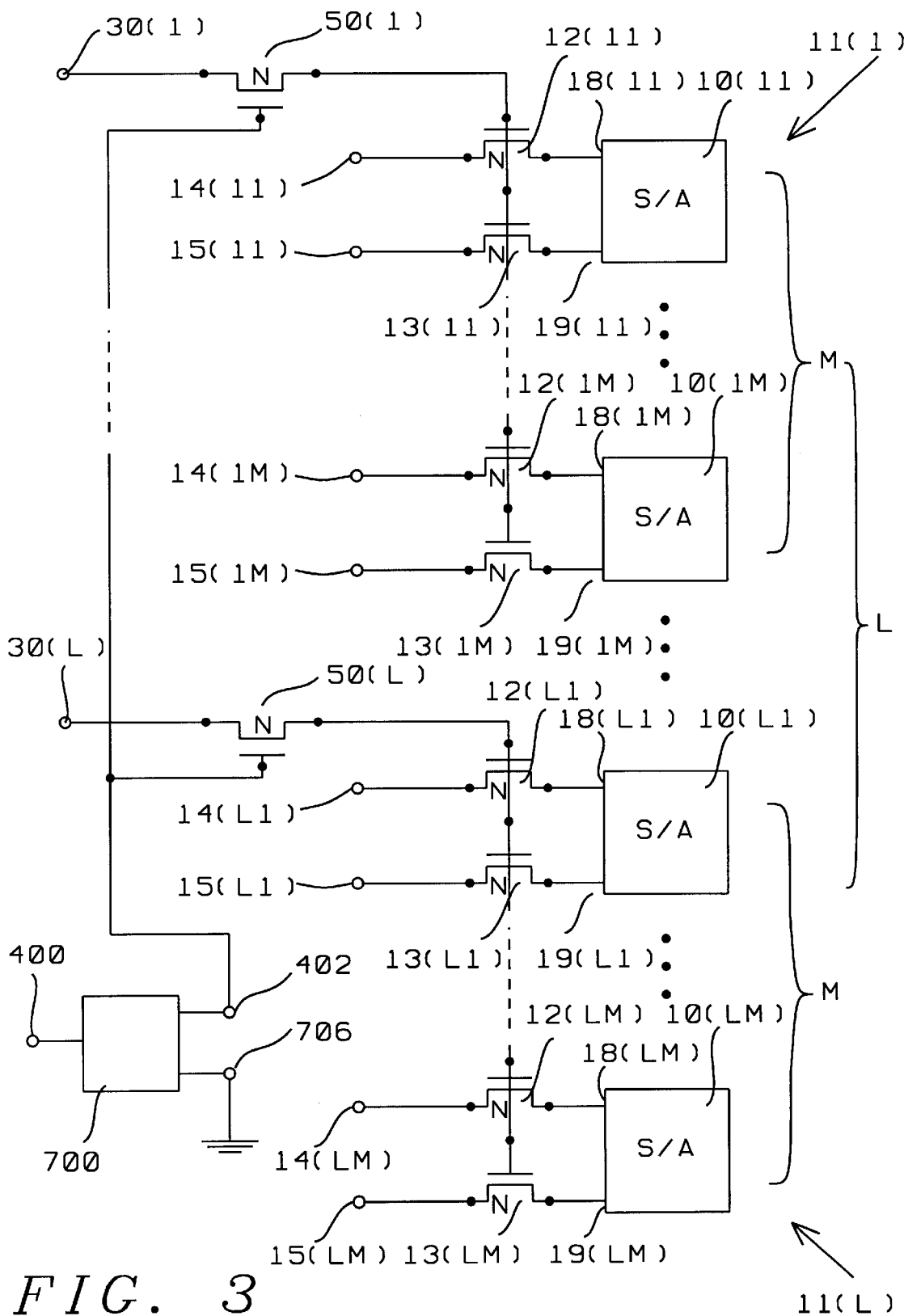
FIG. 3 shows a diagram of a local bit switch circuit using a single N channel field effect transistor in each of the banks of sense amplifiers to select the pass gates in that sense amplifier bank.

The circuit shown in FIG. 3 uses L third N channel field effect transistors 50(i), one in each of the L sense amplifier banks, as local bit select switches. A key part of the invention is that a single N channel field effect transistor 50(i) in each of the L sense amplifier banks provides the function of a local bit select switch. This is a substantial savings in device area over conventional methods, such as the circuits shown in FIGS. 1 and 2 requiring four or five transistors, for providing the function of a local bit select switch. Each of the third N channel field effect transistors 50(i) has a source, drain, gate, and the first threshold voltage. For each of the third N channel field effect transistors 50(i) the source is connected to the bit select line 30(i) for one of the sense amplifier banks 11(i) and the drain is connected to gates of all of the first N channel field effect transistors 12(ij) and all of the second N channel field effect transistors 13(ij) in that sense amplifier bank 11(i). In the reference numbers 30(i) and 50(i), i takes on all integer values from 1 to L.

All of the gates of the third N channel field effect transistors 50(i) are connected to the output 402 of a boost voltage supply 700. The global bit select line 400 is connected to the input of the boost voltage supply 700. The ground terminal 706 of the boost voltage supply 700 is connected to ground potential. When the global bit select line 400 is low, about ground potential, the output 402 of the boost voltage supply 700 is at a boosted high voltage level which is larger than the voltage level of the local bit select lines 30(i) when the local bit select lines 30(i) are high. When the global bit select line 400 is high, the output 402 of the boost voltage supply 700 is at a modified ground voltage which is the first threshold voltage above ground potential.

The high voltage levels for the global bit select line 400, the local bit select lines 30(i), the first data lines 14(ij), and the second data lines 15(ij) are the same and are above ground potential. The low voltage levels for the global bit select line 400, the local bit select lines 30(i), the first data lines 14(ij), and the second data lines 15(ij) are the same and, in this example, equal to ground potential. All voltages described herein are referenced to ground potential. The operation of the boost voltage supply 700 will be described later.

When the global bit line 400 is low, the gate potential of the third N channel field effect transistors 50(i) are above the voltage on the local bit select lines 30(i), whether the local bit select lines 30(i) are high or low, and the third N channel field effect transistors 50(i) are in a conducting mode and connect local bit select lines 30(i) to the gates of the first N channel field effect transistors 12(ij) and the second N channel field effect transistors 13(ij).

When the global bit line 400 is high the third N channel field effect transistors 50(i) are in a non conducting mode and the local bit select lines 30(i) are isolated from the gates of the first N channel field effect transistors 12(ij) and the second N channel field effect transistors 13(ij). The cases of the global bit line 400 high and the local bit select line 30(i) also high and the global bit line 400 high and the local bit line 30(i) low are explained in the next paragraphs.

When the global bit line 400 is high and the local bit lines 30(i) are also high, the gate potential of the third N channel field effect transistors 50(i) is below the voltage on the local bit select lines 30(i) and the third N channel field effect transistors 50(i) are in a non conducting mode. The local bit select lines 30(i) are isolated from the gates of the first N channel field effect transistors 12(ij) and the second N channel field effect transistors 13(ij) acting as pass gates. When the global bit line 400 is high and the local bit lines 30(i) are low, the gate potential of the third N channel field effect transistors 50(i) is about the first threshold voltage above ground. A small leakage current through the third N channel field effect transistors 50(i) will tend to raise the voltage of drain of that third N channel field effect transistor 50(i). However, this tendency to increase the drain voltage of that third N channel field effect transistor 50(i) will tend to decrease the leakage current of that third N channel field effect transistor 50(i) and the third N channel field effect transistor 50(i) will essentially be in a non conducting mode and isolate the local bit select lines 30(i) from the gates of the first N channel field effect transistors 12(ij) and the second N channel field effect transistors 13(ij) acting as pass gates.

An explanation of the basic operation is as follows. Between data access cycles the gates of the first and second N channel field effect transistors, 12(ij) and 13(ij), are held at ground potential. This is accomplished by taking the global bit select line 400 and local bit select lines 30(i) low. The third N channel field effect transistors 50(i) will be on in this case so that the local bit select lines 30(i) being at the low level holds the gates of the first and second N channel field effect transistors, 12(ij) and 13(ij), actively to ground.

During a data access cycle, if the global bit select line 400 is high, the third N channel field effect transistors 50(i) will be off so that the bank is deselected and the gates of the first and second N channel field effect transistors, 12(ij) and 13(ij), will be low regardless of the level on the local bit select lines 30(i). This functions in the following way. When the global bit select line 400 is low, node 402 maintains the gates of the third N channel field effect transistors 50(i) at the first threshold voltage above ground by the boost voltage supply 700. When a local bit select line 30(i) is also low, the third N channel field effect transistor 50(i) will allow a small leakage current to flow between the local bit select line 30(i) and gates of the first and second N channel field effect transistors, 12(ij) and 13(ij), thereby maintaining the gates of the first and second N channel field effect transistors, 12(ij) and 13(ij), rigorously at ground.

When the global bit select line 400 is low and a local bit select line 30(i) is high there will be a subthreshold MOS channel current in the third N channel field effect transistor 50(i) in such a direction as to tend to raise the gates of the first and second N channel field effect transistors, 12(ij) and 13(ij), above ground. This small leakage current, according to standard MOS device physics, decreases by about a factor of 10 with each 0.1 volt of rise of the voltage on the gates of the first and second N channel field effect transistors, 12(ij) and 13(ij), above ground. In normal operation, this current can typically raise the voltage on the gates of the first and second N channel field effect transistors, 12(ij) and 13(ij), by only a fraction of one MOS transistor threshold voltage, maintaining the first and second N channel field effect transistors, 12(ij) and 13(ij), in the off or subthreshold state throughout the cycle. Any small currents, in the range of nanoamps, that may flow through the first and second N channel field effect transistors, 12(ij) and 13(ij), due to the fact that the gates of the first and second N channel field effect transistors, 12(ij) and 13(ij), are not exactly at ground potential will be absorbed by the sense amplifiers 10(ij) and data path circuitry without affecting normal operation.

A local bit select line 30(i) being low indicates an unselected local bit select line. A local bit select line 30(i) being high indicates a selected local bit select line. There is only one selected local bit select line per sub-array and many unselected local bit select lines. Since the gates of third N channel field effect transistors 50(i) corresponding to the unselected bit select lines are held firmly at ground, the possibility of partial selection of sufficient first or second N channel field effect transistors, 12(ij) or 13(ij), to disturb the data lines and cause malfunction is eliminated.

Figure 4:
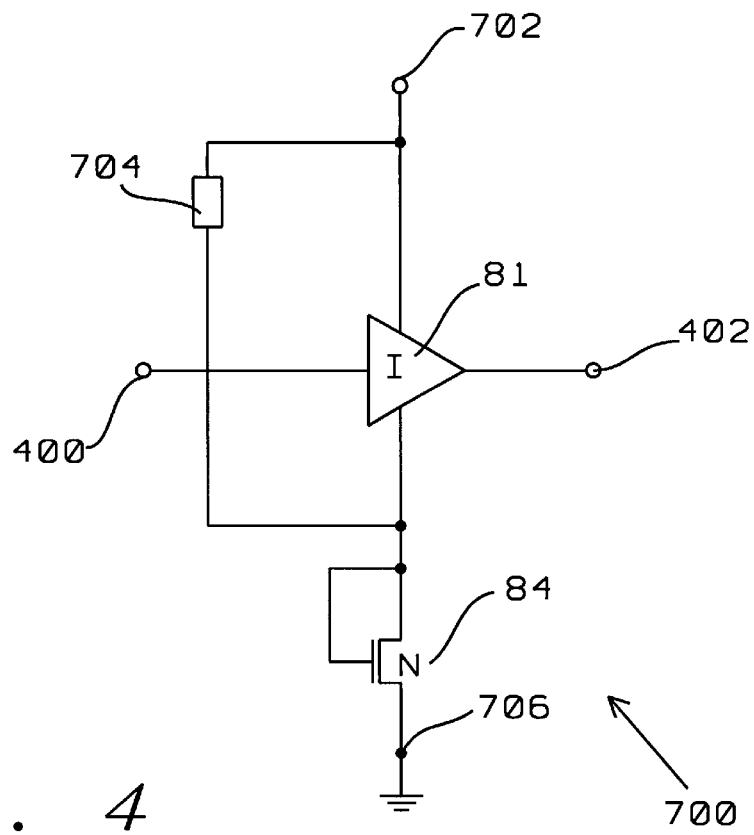
FIG. 4 shows a diagram of the boost voltage supply for the local bit switch circuit of FIG. 3.
Figure 5:
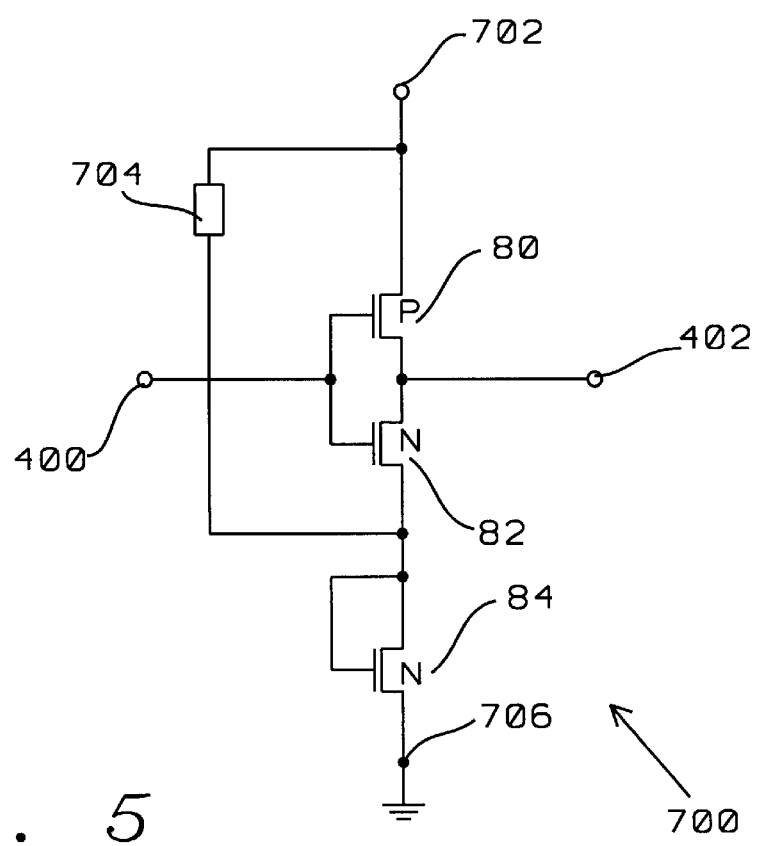
FIG. 5 shows a more detailed diagram of the boost voltage supply for the local bit switch circuit of FIG. 3.

A more detailed view of the boost voltage supply 700 is shown in FIGS. 4 and 5. FIG. 4 shows a diagram of the boost voltage supply showing an inverter 81 connected to a supply terminal 702 held at a boosted voltage level. A fourth N channel field effect transistor 84, having the first threshold voltage, is connected in diode mode between the inverter 81 and the ground terminal 706. The input of the inverter 81 is connected to the global bit select line 400 and the output of the inverter 81 is connected to the output terminal 402 of the boost voltage supply 700. A small bleeder device 704 is connected between the supply terminal 702 and the positive side of diode connected fourth N channel field effect transistor 84.

FIG. 5 shows a more detailed view of the boost power supply 700. The inverter comprises a first P channel field effect transistor 80 and a fifth N channel field effect transistor 82. When the global bit select line 400 is low the output terminal 402 is connected through the first P channel field effect transistor 80 to the supply terminal 702 and the voltage at the output terminal 402, referenced to ground, is the boosted voltage level. When the global bit select line 400 is high the output terminal 402 is connected through the fifth N channel field effect transistor 82 to the fourth N channel field effect transistor 84 connected in diode mode and the voltage at the output terminal 402, referenced to ground, is the first threshold voltage. The bleeder device 704 is connected between the supply terminal 702 and the node between the fifth N channel field effect transistor 82 and the fourth N channel field effect transistor 84 connected in diode mode. The bleeder device 704 helps maintain the output terminal 402 at the first threshold voltage above ground when the voltage at node 400 is high. The bleeder device 704 and provides a small current which is balanced against the subthreshold leakage current of the fourth N channel field effect transistor 84, and prevents the subthreshold leakage current of the fourth N channel field effect transistor 84 from pulling node 402 towards ground.

Refer again to FIGS. 3–5 for another preferred embodiment of the local bit switch selecting circuit of this invention. The difference between this embodiment and the previous embodiment is that in this embodiment the threshold voltage of the third N channel field effect transistors 50(i) and the fourth N channel field effect transistor 84, FIGS. 4 and 5, is a second threshold voltage. The first threshold voltage is larger than the second threshold voltage, in this example by about 0.2 volts. In this embodiment, when the global bit select line 400 is low, about ground potential, the output 402 of the boost voltage supply 700 is at a boosted high voltage level which is larger than the voltage level of the local bit select lines 30(i) when the local bit select lines 30(i) are high. When the global bit select line 400 is high, the output 402 of the boost voltage supply 700 is at a modified ground voltage which is above ground potential by the second threshold voltage.

Since the first threshold voltage is larger than the second threshold voltage in this embodiment the leakage current through the third N channel field effect transistor when the global bit select line 400 is high and the local bit select lines 30(i) are low is reduced when compared to the previous embodiment.

The circuits of these embodiments provide a global bit switch scheme wherein the bit switch will be activated across a number of sense amplifiers within a single bank simultaneously. The circuits of these embodiments require only one N channel field effect transistor 50(i) in each sense amplifier bank 11(i), thereby providing considerable savings in the chip area required when compared to prior art circuits.

While the invention has been particularly shown and described with reference to the preferred embodiments thereof, it will be understood by those skilled in the art that various changes in form and details may be made without departing from the spirit and scope of the invention.

What is claimed is:

1. A bit switch decode circuit, comprising:

a first number of sense amplifier banks;

a first number of local bit select lines wherein each of said local bit select lines is at a high level or a low level;

a second number of sense amplifiers in each of said sense amplifier banks, wherein each of said sense amplifiers has a first input and a second input;

a first transistor in each of said sense amplifier banks wherein each of said first transistors is an N channel field effect transistor having a source connected to a first data line, a drain connected to said first input of one of said sense amplifiers in that said sense amplifier bank, a gate, and a threshold voltage;

a second transistor in each of said sense amplifier banks wherein each of said second transistors is an N channel field effect transistor having a source connected to a second data line, a drain connected to said second input of one of said sense amplifiers in that said sense amplifier bank, a gate, and a threshold voltage;

a third transistor in each of said sense amplifier banks, wherein each of said third transistors is an N channel field effect transistor having a source connected to said gates of each of said first and said second transistors in that said sense amplifier bank, a drain connected to one of said local bit select lines, a gate, and said threshold voltage;

a global bit select line, wherein said global bit select line is at said high level or said low level; and a voltage source connected to said global bit line wherein said voltage source supplies a selecting voltage between said gates of each of said third transistors and ground potential when said global bit line is at said low level and a voltage about equal to said threshold voltage between said gates of each of said third transistors and ground potential when said global bit line is at said high level and a voltage about equal to said threshold voltage.

2. The bit switch decode circuit of claim 1 wherein first number is between two or more.

3. The bit switch decode circuit of claim 1 wherein said second number is two or more.

4. The bit switch decode circuit of claim 1 wherein said voltage source comprises a fourth transistor, wherein said fourth transistor is an N channel field effect transistor having a source, a drain, a gate connected to said source of said fourth transistor, and said threshold voltage.

5. The bit switch decode circuit of claim 1 wherein said voltage source comprises an inverter and a fourth transistor, wherein said fourth transistor is an N channel field effect transistor having a source connected to ground potential, a drain connected to the pull down path of said inverter, a gate connected to said drain of said fourth transistor, and said threshold voltage.

6. A bit switch decode circuit, comprising:

a first number of sense amplifier banks;

a first number of local bit select lines, wherein each of said local bit select lines is at a high level or a low level;

a second number of sense amplifiers in each of said sense amplifier banks, wherein each of said sense amplifiers has a first input and a second input;

a first transistor in each of said sense amplifier banks wherein each of said first transistors is an N channel field effect transistor having a source connected to a first data line, a drain connected to said first input of one of said sense amplifiers in that said sense amplifier bank, a gate, and a first threshold voltage;

a second transistor in each of said sense amplifier banks wherein each of said second transistors is an N channel field effect transistor having a source connected to a second data line, a drain connected to said second input of one of said sense amplifiers in that said sense amplifier bank, a gate, and said first threshold voltage;

a third transistor in each of said sense amplifier banks, wherein each of said third transistors is an N channel field effect transistor having a source connected to said gates of each of said first and said second transistors in that said sense amplifier bank, a drain connected to one of said local bit select lines, a gate, and a second threshold voltage;

a global bit select line, wherein said global bit select line is at said high level or said low level; and a voltage source connected to said global bit line wherein said voltage source supplies a selecting voltage between said gates of each of said third transistors and ground potential when said global bit select line is at said low level and a voltage about equal to said second threshold voltage between said gates of each of said third transistors and ground potential when said global bit select line is at said high level.

7. The bit switch decode circuit of claim 6 wherein first number is two or more.

8. The bit switch decode circuit of claim 6 wherein said second number is two or more.

9. The bit switch decode circuit of claim 6 wherein said voltage source comprises a fourth transistor, wherein said fourth transistor is an N channel field effect transistor having a source, a drain, a gate connected to said source of said fourth transistor, and said second threshold voltage.

10. The bit switch decode circuit of claim 6 wherein said voltage source comprises an inverter and a fourth transistor, wherein said fourth transistor is an N channel field effect transistor having a source connected to ground potential, a drain connected to the pull down path of said inverter, a gate connected to said drain of said fourth transistor, and said second threshold voltage.

11. The bit switch decode circuit of claim 6 wherein said first threshold voltage is greater than said second threshold voltage.

12. A bit switch decode circuit, comprising:

a first number of sense amplifier banks;

a first number of local bit select lines;

a global bit select line;

a second number of sense amplifiers in each of said sense amplifier banks, wherein each of said sense amplifiers has a first input and a second input;

a first pass gate in each of said sense amplifier banks connected between a first data line and said first input of one of said sense amplifiers in that said sense amplifier bank;

a second pass gate in each of said sense amplifier banks connected between a second data line and said second input of one of said sense amplifiers in that said sense amplifier bank; and a third pass gate in each of said sense amplifier banks, wherein said third pass gate is a single field effect transistor connected between said gates of each of said first and said second N channel field effect transistors in that said sense amplifier bank and one of said local bit select lines and passes a selecting voltage or a non selecting voltage from that said local bit select line to said first pass gates and said second pass gates when said third pass gate is selected by said global bit select line.

13. The bit switch decode circuit of claim 12 wherein:

said first pass gate is a first N channel field effect transistor having a source connected to said first data line, a drain connected to said first input of one of said sense amplifiers in that said sense amplifier bank, a gate, and a threshold voltage;

said second pass gate is a second N channel field effect transistor having a source connected to said second data line, a drain connected to said second input of one of said sense amplifiers in that said sense amplifier bank, a gate, and said threshold voltage; and said third pass gate is a third N channel field effect transistor having a source connected to said gates of each of said first and said second N channel field effect transistors in that said sense amplifier bank, a drain connected to one of said local bit select lines, a gate, and said threshold voltage.

14. The bit switch decode circuit of claim 12 wherein:

said first pass gate is a first N channel field effect transistor having a source connected to said first data line, a drain connected to said first input of one of said sense amplifiers in that said sense amplifier bank, a gate, and a first threshold voltage;

said second pass gate is a second N channel field effect transistor having a source connected to said second data line, a drain connected to said second input of one of said sense amplifiers in that said sense amplifier bank, a gate, and said first threshold voltage; and said third pass gate is a third N channel field effect transistor having a source connected to said gates of each of said first and said second N channel field effect transistors in that said sense amplifier bank, a drain connected to one of said local bit select lines, a gate, and a second threshold voltage.

15. The bit switch decode circuit of claim 14 wherein said first threshold voltage is greater than said second threshold voltage.

16. The bit switch decode circuit of claim 13 further comprising a voltage source connected to said global bit select line wherein said voltage source has an inverter and a fourth N channel field effect transistor having a source, a drain, a gate connected to said source of said fourth channel field effect transistor, and said threshold voltage and is connected in series with the pull down path of said inverter.

17. The bit switch decode circuit of claim 14 further comprising a voltage source connected to said global bit select line wherein said voltage source has an inverter and a fourth N channel field effect transistor having a source connected to ground potential, a drain connected to the pull down path of said inverter, a gate connected to said drain of said fourth channel field effect transistor, and said second threshold voltage.

18. A method of bit switch decoding, comprising:

providing a global bit select line, wherein said global bit select line is either at a high level or a low level;

providing a first number of sense amplifier banks;

providing a first number of local bit select lines, wherein each of said local bit select lines is either at a high level or a low level;

providing a second number of sense amplifiers in each of said sense amplifier banks, wherein each of said sense amplifiers has a first input and a second input;

providing a first transistor in each of said sense amplifier banks wherein each of said first transistors is an N channel field effect transistor having a source connected to a first data line, a drain connected to said first input of one of said sense amplifiers in that said sense amplifier bank, a gate, and a threshold voltage;

providing a second transistor in each of said sense amplifier banks wherein each of said second transistors is an N channel field effect transistor having a source connected to a second data line, a drain connected to said second input of one of said sense amplifiers in that said sense amplifier bank, a gate, and a threshold voltage;

providing a third transistor in each of said sense amplifier banks, wherein each of said third transistors is an N channel field effect transistor having a source connected to said gates of each of said first and said second transistors in that said sense amplifier bank, a drain, a gate, and said threshold voltage;

connecting each of said local bit select lines to said drain of one of said third N channel field effect transistors;

providing a voltage source having an input connected to said global bit select line and an output wherein said voltage source produces a voltage between said output of said voltage source and ground potential equal to a selecting voltage when said global bit select line is at said low level and said threshold voltage when said global bit select line is at said high level; and connecting said gates of each of said third transistors to said output of said voltage source.

19. The method of claim 18 wherein first number is between two or more.

20. The method of claim 18 wherein said second number is two or more.

21. The method of claim 18 wherein said voltage source comprises a fourth transistor, wherein said fourth transistor is an N channel field effect transistor having a source, a drain, a gate connected to said source of said fourth transistor, and said threshold voltage.

22. The method of claim 18 wherein said voltage source comprises an inverter and a fourth transistor, wherein said fourth transistor is an N channel field effect transistor having a source connected to ground potential, a drain connected to the pull down path of said inverter, a gate connected to said drain of said fourth transistor, and said threshold voltage.

23. A method of bit switch decoding, comprising:

providing a global bit select line, wherein said global bit select line is either at a high level or a low level;

providing a first number of sense amplifier banks;

providing a first number of local bit select lines, wherein each of said local bit select lines is either at a high level or a low level;

providing a second number of sense amplifiers in each of said sense amplifier banks, wherein each of said sense amplifiers has a first input and a second input;

providing a first transistor in each of said sense amplifier banks wherein each of said first transistors is an N channel field effect transistor having a source connected to a first data line, a drain connected to said first input of one of said sense amplifiers in that said sense amplifier bank, a gate, and a first threshold voltage;

providing a second transistor in each of said sense amplifier banks wherein each of said second transistors is an N channel field effect transistor having a source connected to a second data line, a drain connected to said second input of one of said sense amplifiers in that said sense amplifier bank, a gate, and said first threshold voltage;

providing a third transistor in each of said sense amplifier banks, wherein each of said third transistors is an N channel field effect transistor having a source connected to said gates of each of said first and said second transistors in that said sense amplifier bank, a gate, and a second threshold voltage;

connecting each of said local bit select lines to said drain of one of said third N channel field effect transistors;

providing a voltage source having an input connected to said global bit select line and an output wherein said voltage source produces a voltage between said output of said voltage source and ground potential equal to a selecting voltage when said global bit select line is at said low level and said second threshold voltage when said global bit select line is at said high level; and connecting said gates of each of said third transistors to said output of said voltage source.

24. The method of claim 23 wherein first number is two or more.

25. The method of claim 23 wherein said second number is two or more.

26. The method of claim 23 wherein said voltage source comprises a fourth transistor, wherein said fourth transistor is an N channel field effect transistor having a source, a drain, a gate connected to said source of said fourth transistor, and said second threshold voltage.

27. The method of claim 23 wherein said voltage source comprises an inverter and a fourth transistor, wherein said fourth transistor is an N channel field effect transistor having a source connected to ground potential, a drain connected to the pull down path of said inverter, a gate connected to said drain of said fourth transistor, and said second threshold voltage.

28. The method of claim 23 wherein said first threshold voltage is greater than said second threshold voltage.

* * * * *